US008349650B1

(12) United States Patent
Brewer et al.

(10) Patent No.: US 8,349,650 B1
(45) Date of Patent: Jan. 8, 2013

(54) MULTI-LAYERED INTEGRATED CIRCUIT AND APPARATUS WITH THERMAL MANAGEMENT AND METHOD

(75) Inventors: Peter D. Brewer, Westlake Village, CA (US); Keith V. Guinn, Thousand Oaks, CA (US); Jonathan J. Lynch, Oxnard, CA (US)

(73) Assignee: HRL Laboratories, LLC, Malibu, CA (US)

( * ) Notice: Subject to any disclaimer, the term of this patent is extended or adjusted under 35 U.S.C. 154(b) by 139 days.

(21) Appl. No.: 13/038,244

(22) Filed: Mar. 1, 2011

Related U.S. Application Data

(62) Division of application No. 12/189,739, filed on Aug. 11, 2008, now Pat. No. 7,956,381.

(51) Int. Cl.
*H01L 21/44* (2006.01)
(52) U.S. Cl. ............ 438/107; 438/458; 257/E21.614
(58) Field of Classification Search .......... 438/107, 438/109, 118, 456; 257/E21.614
See application file for complete search history.

(56) References Cited

U.S. PATENT DOCUMENTS

| 6,794,747 | B2  | 9/2004  | Takehara et al. |
| 7,126,212 | B2  | 10/2006 | Enquist et al.  |
| 7,679,914 | B2  | 3/2010  | Kashiwazaki     |
| 7,791,151 | B2* | 9/2010  | Vaganov et al. ............ 257/417 |
| 2005/0186800 | A1 | 8/2005 | Brewer |

OTHER PUBLICATIONS

Moran, P.D., et al., "Fabrication of InAs/AlSb/GaSb heterojunction bipolar transistors on $Al_2O_3$ substrates by wafer bonding," Applied Physics Letters, vol. 78, No. 15, Apr. 9, 2001, pp. 2232-2234.

* cited by examiner

*Primary Examiner* — Quoc Hoang
(74) *Attorney, Agent, or Firm* — Christie, Parker & Hale, LLP

(57) ABSTRACT

A multi-layered semiconductor apparatus capable of producing at least 500 W of continuous power includes at least two device substrates arranged in a stack. Each of the at least two device substrates has a first side and a second side opposite to the first side, and each of the at least two device substrates is configured to produce an average power density higher than 100 $W/cm^2$. A plurality of active devices are provided on the first side of each of the at least two device substrates. The plurality of active devices are radiatively coupled among the at least two device substrates. At least one of the at least two device substrates is structured to provide a plurality of cavities on its second side to receive corresponding ones of the plurality of active devices on the first side of an adjacent one of the at least two device substrates.

5 Claims, 11 Drawing Sheets

| InP Layer 1: 170°C |
| InP Layer 2: 128°C |
| InP Layer 3: 107°C |
| InP Layer 4: 74°C |

| InP/Si Layer 1: 77°C |
| InP/Si Layer 2: 57°C |
| InP/Si Layer 3: 48°C |
| InP/Si Layer 4: 33°C |

FIG. 7b

| InP/SiC Layer 1: 33°C |
| InP/SiC Layer 2: 27°C |
| InP/SiC Layer 3: 23°C |
| InP/SiC Layer 4: 16°C |

MULTI-LAYERED INTEGRATED CIRCUIT AND APPARATUS WITH THERMAL MANAGEMENT AND METHOD

CROSS-REFERENCE TO RELATED APPLICATION(S)

The present application is a divisional application of U.S. patent application Ser. No. 12/189,739, filed on Aug. 11, 2008 now U.S. Pat. No. 7,956,381, the entire content of which is hereby expressly incorporated by reference.

BACKGROUND OF THE INVENTION

1. Field of the Invention

The present invention relates to thermal management of high heat flux multi-layer integrated circuits, and more particularly, to a method of fabrication of high heat flux multi-layer integrated circuits with enhanced thermal management, and apparatus thereof.

2. Description of the Related Art

Thermal management is an important consideration in the fabrication of high power integrated circuits (ICs) and RF electronics. Many approaches have been applied to the integrated circuit (IC) heat rejection problem ranging from the chip level to the packaging level. These approaches include both active and passive cooling, as well a conductive, convective, and radiative-based methods. In terms of addressing the limitations of the growth substrates of the high power ICs to conduct heat from vertically stacked configurations, only substrate thinning and thermal vias through the stack have been reported. Thinning of the growth substrate is a common practice in microelectronic technologies. For example, multi-layer silicon processors have demonstrated thinning down to the 10-micron level to support high levels of interconnection between the layers. In these stacked IC layers, thermal vias have also been reported to aid in the heat transfer through the stack.

In additional, epilayer transfer methods have been utilized in 2D circuit configurations to replace a growth substrate with a host substrate with better thermal conductivity. However, when multiple IC layers are stacked together, the thermal expansion mismatch problem is often encountered when joining dissimilar materials.

Therefore, it is desirable to have a multi-layer IC apparatus with good thermal management characteristics and a corresponding method of fabricating such apparatus.

SUMMARY OF THE INVENTION

In accordance with embodiments of the present invention, a multi-layered semiconductor apparatus and a multi-layered RF power apparatus both capable of producing at least 1 kW of continuous power and a method for fabricating a multi-layered amplifier apparatus capable of producing at least 1 kW of continuous power are provided.

According to an embodiment of the present invention, a multi-layered semiconductor apparatus capable of producing at least 1 kW of continuous power is provided. The multi-layered semiconductor apparatus includes at least two device substrates arranged in a stack, wherein each of the at least two device substrates has a first side and a second side opposite to the first side, and each of the at least two device substrates is configured to produce an average power density higher than 100 W/cm2, and a plurality of active devices on the first side of each of the at least two device substrates. The plurality of active devices are radiatively coupled among the at least two device substrates. At least one of the at least two device substrates is structured to provide a plurality of cavities on its second side to receive corresponding ones of the plurality of active devices on the first side of an adjacent one of the at least two device substrates.

The plurality of active devices may include differential amplifier pairs. Each of the at least two device substrates may be selected from one of silicon carbide, silicon, or diamond. Each of the at least two device substrates may have a thermal conductivity higher than 150 W/(m·K).

The plurality of active devices may be grown and epitaxially transferred to the at least two device substrates from a growth substrate having a thermal conductivity lower than that of the at least two device substrates. The at least two device substrates may be bonded together by direct bonding or thermocompression.

According to another embodiment of the present invention, a multi-layered RF power apparatus capable of producing at least 1 kW of continuous power is provided. The multi-layered RF power apparatus includes at least two grid amplifier array layers arranged in a stack, each of the at least two grid amplifier array layers having a first side and a second side opposite to the first side and each of the at least two grid amplifier array layers configured to produce an average power density higher than 100 W/cm2, and a plurality of amplifiers on the first sides of the at least two grid amplifier array layers. The plurality of amplifiers are radiatively coupled among the at least two grid amplifier array layers for providing amplification of millimeter wave radiation. At least one of the at least two grid amplifier array layers is structured to provide a plurality of cavities on its second side to receive corresponding ones of the plurality of amplifiers on the first side of an adjacent one of the at least two grid amplifier array layers.

The plurality of amplifiers may include differential amplifier pairs. Each of the at least two grid amplifier array layers may include a host substrate selected from one of silicon, silicon carbide, aluminum nitride, or diamond. Each of the at least two grid amplifier array layers may include a host substrate having a thermal conductivity higher than 150 W/(m·K). The plurality of amplifiers may be grown and epitaxially transferred to the host substrate from a growth substrate having a thermal conductivity lower than that of the host substrate. The at least two grid amplifier array layers may be bonded together by direct bonding or thermocompression.

According to yet another embodiment of the present invention, a method of fabricating a multi-layered amplifier apparatus capable of producing at least 1 kW of continuous power is provided. The method includes forming a plurality of amplifier devices on first sides of a plurality of semiconductor substrates arranged in a stack. Each of the plurality of semiconductor substrates is configured to produced an average power density higher than 100 W/cm$^2$. A plurality of cavities are formed on a second side of at least one of the plurality of semiconductor substrates. The plurality of cavities are structured to receive corresponding ones of the plurality of amplifier devices on an adjacent one of the plurality of semiconductor substrates. The plurality of semiconductor substrates are bonded together. The plurality of semiconductor substrates each have thermal conductivities higher than 150 W/(m·K).

Said forming the plurality of amplifier devices on the first sides of the plurality of semiconductor substrates may include providing an epitaxial layer on a growth substrate, the epitaxial layer having one or more device layers, one of the one or more device layers being an external device layer distal from the growth substrate. The external device layer may be bonded to one of the plurality of semiconductor substrates having a thermal conductivity higher than that of the growth substrate. The growth substrate may be removed, and one or more amplifier devices may be fabricated from the one or more device layers of the epitaxial layer. The plurality of semiconductor substrates may include one of silicon, silicon carbide, aluminum nitride, or diamond. The plurality of semiconductor substrates may be bonded together by direct bonding or thermocompression.

BRIEF DESCRIPTION OF THE DRAWINGS

FIGS. 7a, 7b and 7c show diagrams of simulated temperature distributions in multi-layer IC structures, such as those described with reference to FIG. 6.

DETAILED DESCRIPTION OF EXEMPLARY EMBODIMENTS

Embodiments of the present invention provide an approach to improving the thermal management of high power RF electronics and integrated circuits that are configured in vertical stacks. This approach is particularly suited to heat rejection in millimeter wave radiation sources, such as stacked high power grid amplifier arrays and phased array antennas, where system demands are driving these technologies to more compact and higher power levels. However, the present invention is not limited thereto.

Embodiments of the present invention also provide a method for transferring active circuit layers from their growth substrates to host substrates that possess superior thermal conductivities and structuring the host substrates such that bonding between layers in the stack allows large areas of low thermal resistance paths between the layers.

Figure 1A:
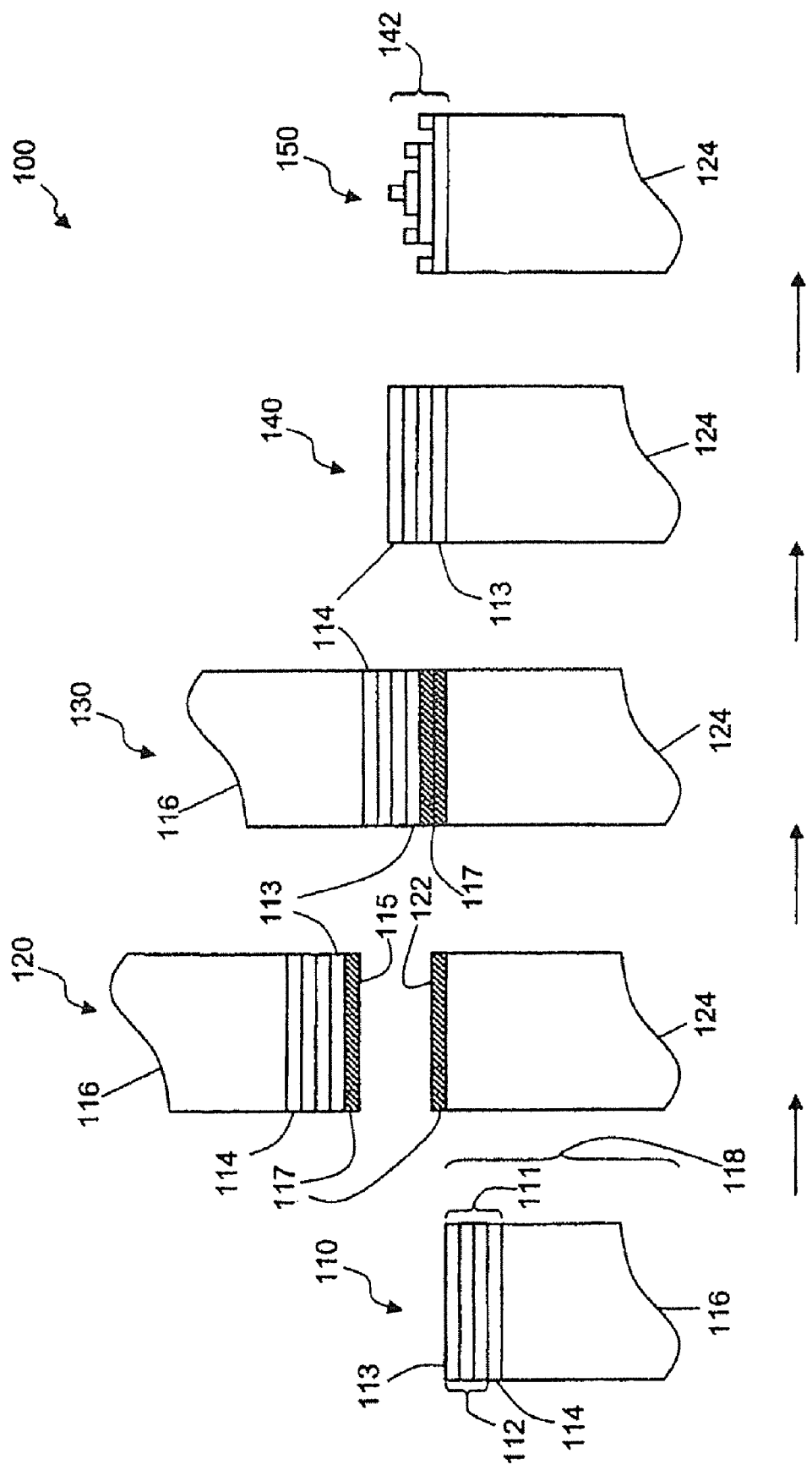
FIG. 1a shows a schematic diagram of an epitaxial layer transfer process in accordance with an embodiment of the present invention.

Referring to FIG. 1a there is shown a diagram of an embodiment of an epitaxial layer transfer process 100. The epitaxial layer transfer process 100 is used to transfer device layers from their respective growth substrates to a host substrate with higher thermal conductivity. For example, the host substrate can be selected to have a thermal conductivity that is equal to or greater than a factor of approximately two or more times the thermal conductivity of the growth substrate. For the purpose of this disclosure, substrates having thermal conductivity higher than 150 W/(m·K) are considered as high thermal conductivity substrates (e.g., diamond, SiC, AlN, and Si).

Substrates having thermal conductivity between 10 to 150 W/(m·K) are considered as moderate thermal conductivity substrates. Substrates having thermal conductivity lower than 10 W/(m·K) are considered as low thermal conductivity substrates.

In step 110, a semiconductor growth wafer 118 includes a growth substrate 116 and an epitaxial layer 111, which is formed of one or more device layers 112 epitaxially grown on the growth substrate 116. The device layers 112 are grown prior to any device lithography and may be grown in a reverse order, i.e., inverted order such that the layer that is typically grown closest to the growth substrate is grown as the topmost device layer, which shall be referred to herein as an "external device layer" 113. In one embodiment, each device layer is a thin layer grown to a thickness of approximately 1 µm.

The epitaxial layer 111 also contains an underlying etch stop layer 114 between the device layers 112 and the growth substrate 116. One skilled in the art would appreciate that the etch stop layer 114 may be composed of any material that can stop an etching process applied to a layer above the etch stop layer 114 from etching into a layer below the etch stop layer 114. Such compositions for etch stop layers are well-known to those of ordinary skill in the art.

The growth substrate 116 is composed of a material that can be used to grow device layers having higher performance than those of device layers grown on a silicon (Si) substrate, for example, but the growth substrate 116 has a thermal conductivity lower than the Si substrate, which has a thermal conductivity around 150 W/(m·K). The material may also cause only a small number of defects on the surface of the external device layer 113. In various embodiments, the growth substrate 116 is composed of indium phosphide (InP), which has a thermal conductivity of approximately 68 W/(m K), gallium arsenide or the like. However, the present invention is not limited thereto.

In step 120, the growth wafer 118 is oriented such that a surface 115 of the external device layer 113 is approximately parallel to a first surface 122 of an alternative substrate 124. The surface 115 and the first surface 122 of the alternative substrate 124 are prepared for bonding by oxygen plasma exposure to each surface. A bonding material 117 is applied to the surface 115 and to the first surface 122 of the alternative substrate 124.

The bonding material 117 has a thermal conductivity that is greater than the thermal conductivity of most conventional bonding materials such as polymer that has a thermal conductivity of approximately 0.5 W/(m K). The bonding material 117 is applied with a thickness of approximately 2-4 µm. Accordingly, the bonding material provides less thermal resistance to the flow of heat in comparison to a polymer bonding material.

In one embodiment, the bonding material 117 is a thin oxide applied to a thickness of approximately 50 Å. Since the bonding material 117 is applied with a thickness that is only a few atomic layers thick, the bonding material 117 does not create a sizeable thermal resistance. In other embodiments, the bonding material 117 can be any other bonding material with a suitable thermal conductivity.

In various embodiments, the bonding material 117 is applied over various areas of the surfaces while complying with the general principle that the manner of application of the bonding material 117 is suitable to maintain the bond upon removal of the growth substrate.

In various embodiments, the alternative substrate 124 may be composed of diamond, silicon carbide (SiC), silicon (Si), aluminum nitride (AlN), or the like. The alternative substrate 124 acts a heat spreader, directing the thermal energy to the periphery of the alternative substrate 124 where a heat sink can be attached to carry away the heat. Accordingly, the heat generated by devices fabricated from the device layers 112 are carried away from the devices to improve performance, reliability and efficiency of device operation.

In step 130, the growth wafer 118 and the alternative substrate 124 are shown to be bonded together by the bonding material 117.

In one embodiment, the growth wafer 118 and the alternative substrate 124 are aligned in a bond fixture using an EV Group Wafer Alignment System (EVG601) and bonded in an EV Group Wafer Bonding System (EVG520) at a temperature less than 150° C. In various embodiments, typical surface energies for the bonded pair are approximately 500 mJ/m$^2$ after bonding.

The oxide-oxide bond is sufficiently strong to withstand removal of the growth substrate 116 by mechanical lapping and polishing, and device processing.

In step 140, once the growth wafer 118 and the alternative substrate 124 are bonded together, the growth substrate 116 may be removed using standard selective wet processes well-known to those of ordinary skill in the art. The growth substrate 116 may also be removed by grinding, chemical-mechanical polishing, or lapping and polishing.

In one embodiment, the growth substrate is lapped and polished down to approximately 150 µm thick and a chemical process is applied to etch away the remaining growth substrate.

In step 150, the etch stop 114 is removed using materials known to those of ordinary skill in the art, leaving the device layers 112 at precise locations and ready for device processing. The device layers 112 (and circuits) are processed into devices 142 and circuits (not shown) using standard fabrication techniques well-known to those of ordinary skill in the art.

In the embodiment shown at step 150, the devices 142 have three layers including devices such as a transistor may be fabricated on the alternative substrate wafer 124. For example, the bottom layer may be fabricated into a collector, the middle layer may be fabricated into a base and the top layer may be fabricated into an emitter. The result may also be a group of ICs 142' or arrays of other devices located on a high thermal conductivity substrate 124' such as that shown with reference to FIG. 1b.

Figure 1B:
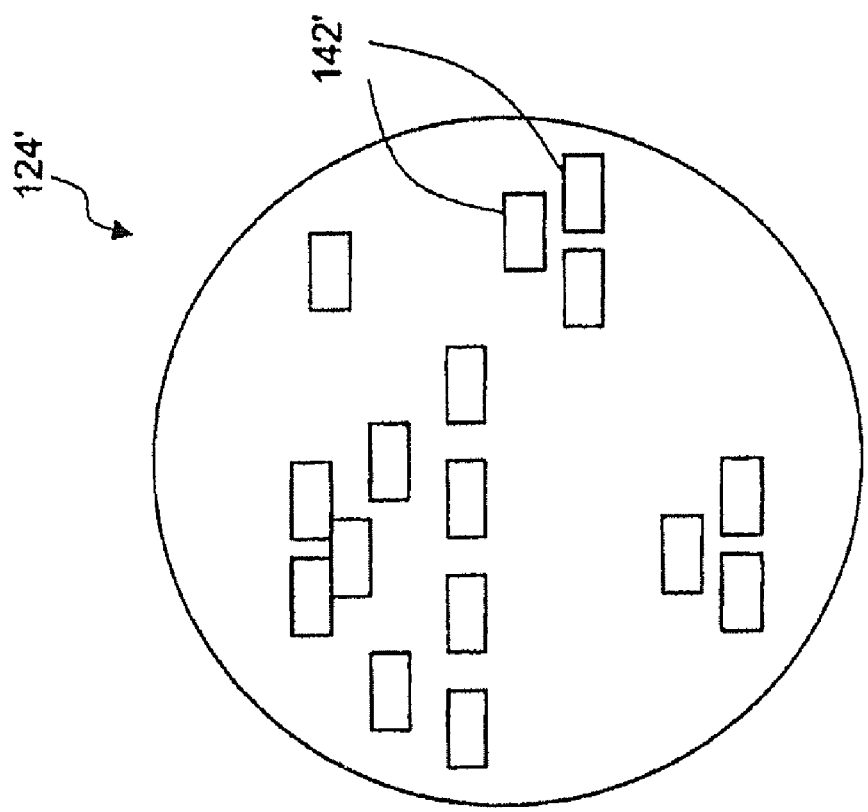
FIG. 1b shows a schematic diagram of a top view of devices on a high thermal conductivity substrate transferred by the epitaxial layer transfer process of FIG. 1a in accordance with an embodiment of the present invention.

FIG. 1b shows a diagram of a top view of devices 142' on the high thermal conductivity substrate 124' after the epitaxial layer transfer process of FIG. 1a is completed. In various embodiments, the devices 142' are transistors, resistors, capacitors, diodes or other devices typically fabricated as part of an integrated circuit, and the substrate 124' can be, for example, diamond, Si, SiC or AlN.

Figure 1C:
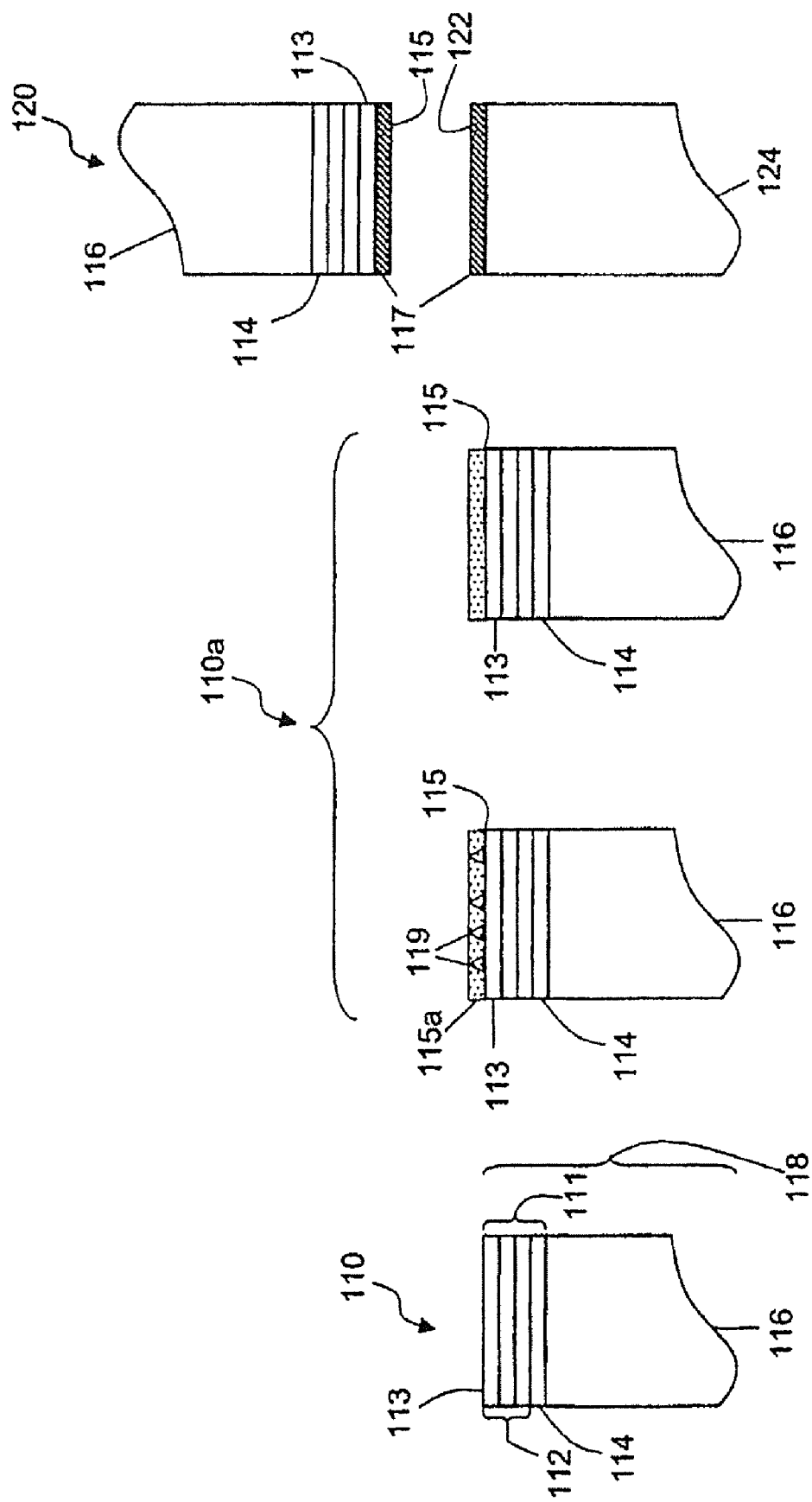
FIG. 1c shows a schematic diagram of the epitaxial layer transfer process of FIG. 1a further adding a defect removal process in accordance with an embodiment of the present invention.

In another embodiment of the epitaxial layer transfer process, a defect removal method such as that described in "Self-Masking Defect Removing Method," United States Patent Application Publication No. 2005/0186800, Ser. No. 10/787,276, and incorporated by reference herein in its entirety, may be performed. FIG. 1c shows a schematic diagram of an embodiment of the epitaxial layer transfer process of FIG. 1a further adding a defect removal process in accordance with the present invention.

Referring to FIG. 1c, a defect removal step 110a may be performed after the step 110 and prior to the step 120. The defect removal step 110a may be performed to remove protruding defects 119 on the surface 115 to increase the bond yield upon bonding. The protruding defects 119 such as oval defects or metal spits occur on the surface 115 due to morphological characteristics of the device layers 112. In one embodiment, using the defect removal step 110a results in a high yield bond of approximately 95%.

Generally, the defect removal step 110a is performed as follows. The surface 115 of the topmost layer of the device layers 112 is coated with a protective layer 115a, which is later thinned to selectively reveal portions of the protruding defects 119. In some embodiments, the protective layer 115a is a photoresist layer applied at a thickness of approximately 5-10 µm. In some embodiments, the photoresist layer may be applied at a thickness of approximately 1000 to 6000 Å. In some embodiments, the protective layer may be silicon oxide or silicon nitride. In some embodiments, the protective layer 115a is deposited using a plasma enhanced chemical vapor deposition (PECVD) method.

The defects 119 are removed by etching. In some embodiments, the defects 119 are removed using a wet chemical etchant such as a citric acid, an HCl or an acetic acid. In other embodiments, the defects 119 are removed using a chemical etchant such as a potassium hydroxide (KOH), water, isopropyl alcohol additive solution; an ethylene diamine pyrocathecol, water, pyrazine additive solution; a tetramethyl ammonium hydroxide (TMAH), water solution; or a hydrazine ($N_2H_4$) water, isopropyl alcohol solution, among other solutions.

Finally, the protective layer 115a is removed. According to the step 110a, inadvertent thinning of the surface is prevented and removal of the defects 119 is obtained. In some embodiments, thinning is performed by buffered oxide etching (BOE), electron cyclotron resonance (ECR) or reactive ion etching (RIB) among other techniques.

Figure 2:
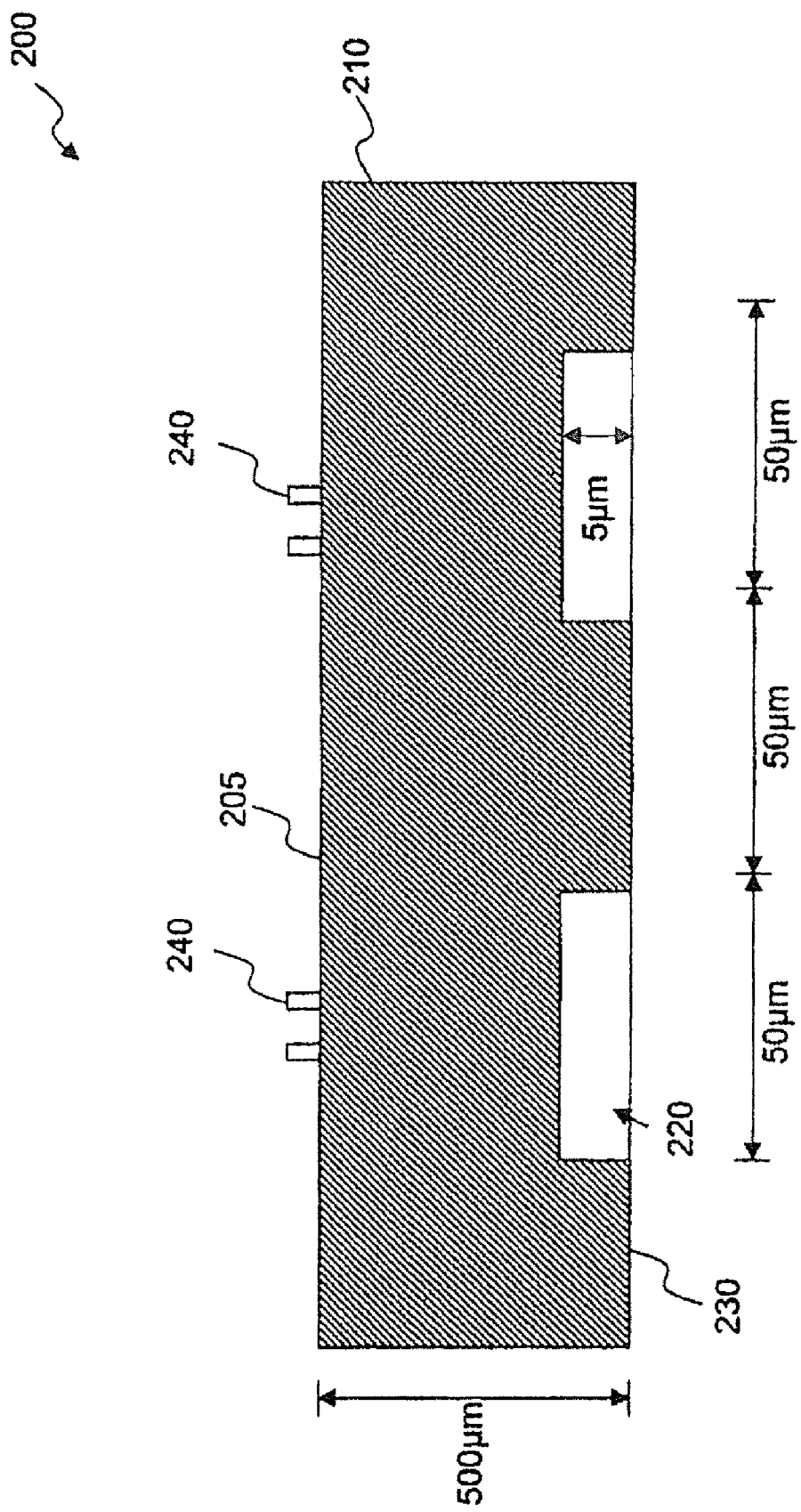
FIG. 2 shows a diagram of a cross-sectional view of a structured wafer in accordance with an embodiment of the present invention.

FIG. 2 shows a diagram of a cross-sectional view of an embodiment of a structured wafer 200 in accordance with the present invention. The structured wafer 200 is one embodiment of the alternative substrate wafer 124 and 124' of FIGS. 1a and 1b, respectively and facilitates forming a multi-layer IC structure.

The structured wafer 200 includes a substrate 210 (e.g., a high thermal conductivity substrate) with one or more devices 240 fabricated on a first surface 205 of the substrate 210. One or more cavities 220 are formed at suitable locations (e.g., predetermined locations) along a second surface 230 of the substrate 210.

In one embodiment, the cavities 220 are formed by the front-to-backside lithography process, which is well-known to those of ordinary skill in the art. The process includes creating alignment targets on the substrate 210 and mask and photoetching cavities according to the alignment targets. In one embodiment, an EV Group 620 Wafer Alignment machine can be used.

In some exemplary embodiments, the substrate 210 may be composed of diamond, which has a thermal conductivity of approximately 2000 W/(m·K); SiC, which has a thermal conductivity of approximately 350 W/(m·K); Si, which has a thermal conductivity of approximately 150 W/(m·K); AlN, or the like.

The cavities 220 of the structured wafer 200 are formed with dimensions that allow a significant amount of the substrate 210 material to be preserved to maintain the benefit of the high thermal conductivity of the substrate 210. In one embodiment, the ratio of the height of the structured wafer 200 to the height of each cavity 220 may be typically maintained between approximately 50:1 and 100:1. For example, in one embodiment, the height of the structured wafer 220 may be 500 µm while the height of the cavity 220 may be 5-10 µm. Additionally, the width of the cavity 220 may be approximately 30-50 µm. Although the cavities 220 are shown and described in a rectangular shape, in other embodiments, the cavities 220 could be designed in other shapes, such as a square shape or a circular shape. Additionally, each device 240 may be of a height of approximately 5 µm. In another embodiment, the cavities 220 may all be of approximately the same dimensions and spaced apart by a distance that is equal to the width of each cavity, e.g., 50 µm.

Figure 3:
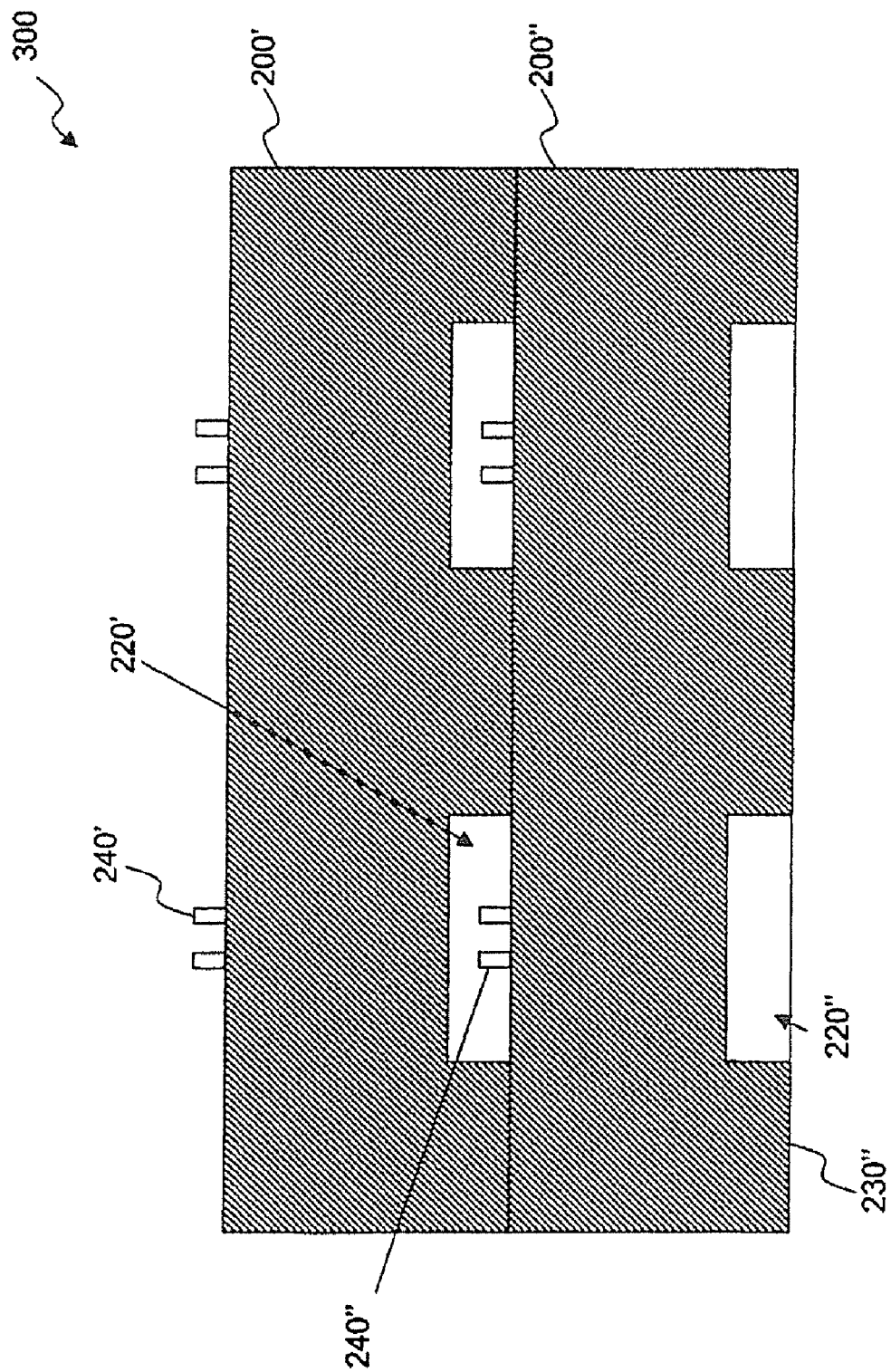
FIG. 3 shows a diagram of a cross-sectional view of a multi-layer IC structure in accordance with an embodiment of the present invention.

FIG. 3 shows a diagram of a cross-sectional view of an embodiment of a multi-layer IC structure 300 in accordance with the present invention. The structure 300 includes two structured wafers 200' and 200" each having cavities and devices as described with reference to FIG. 2, and in a stacked configuration creating the multi-layer IC structure 300.

The cavities 220' of the structured wafer 200' are dimensioned to receive one or more devices 240" fabricated on the structured wafer 200" and are spaced at a suitable spacing (e.g., a predetermined spacing) between the cavities 220' such that heat generated from the devices 240" do not overheat neighboring devices. Accordingly, the spacing is dictated by the number of devices 240" on the wafer 200".

In one embodiment, the cavities 220' are spaced at a distance to receive pairs of devices that must be spaced far enough apart to satisfactorily reduce the effects of mutual heating between pairs of devices. Additionally, the cavities 220' are designed to be of height large enough to serve as a recess for a device 240" fabricated on the second structured wafer 200" with the goal of maximizing the thermal conduction path between the various layers of the multi-layer structure 300.

In alternate embodiments, the locations at which the cavities 220' are formed and the cavity dimensions may have different values.

In the embodiment of FIG. 3, wafer 200" is shown as a structured wafer having cavities 220" along its second surface 230". In alternate embodiments, however, the bottommost wafer in the multi-layer structure need not include cavities. The wafers 200' and 200" may be bonded together through processes described with reference to FIGS. 4 and 5.

Figure 4:
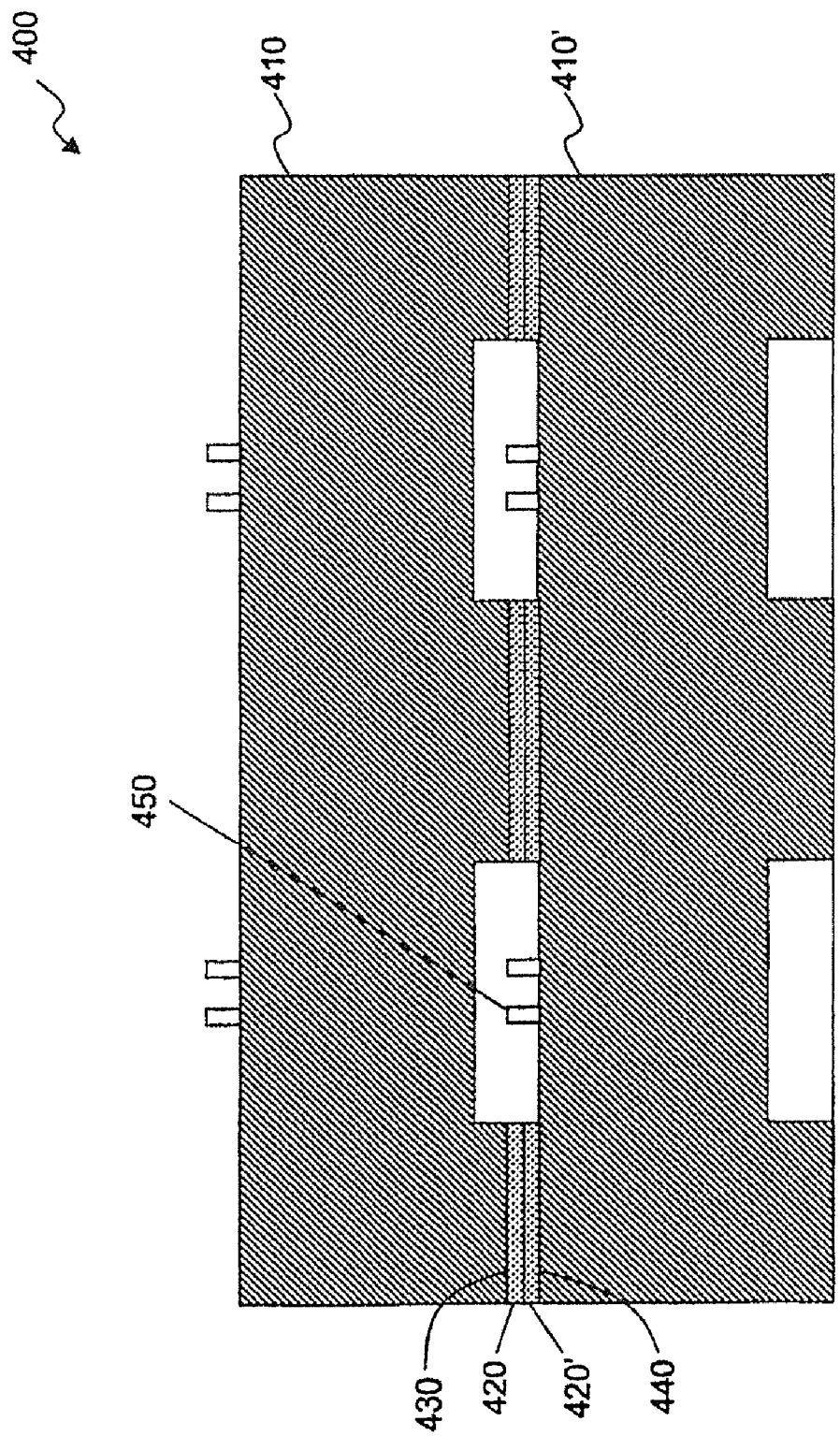
FIG. 4 shows a diagram of a cross-sectional view of a multi-layer IC structure formed through direct bonding in accordance with an embodiment of the present invention.
Figure 5:
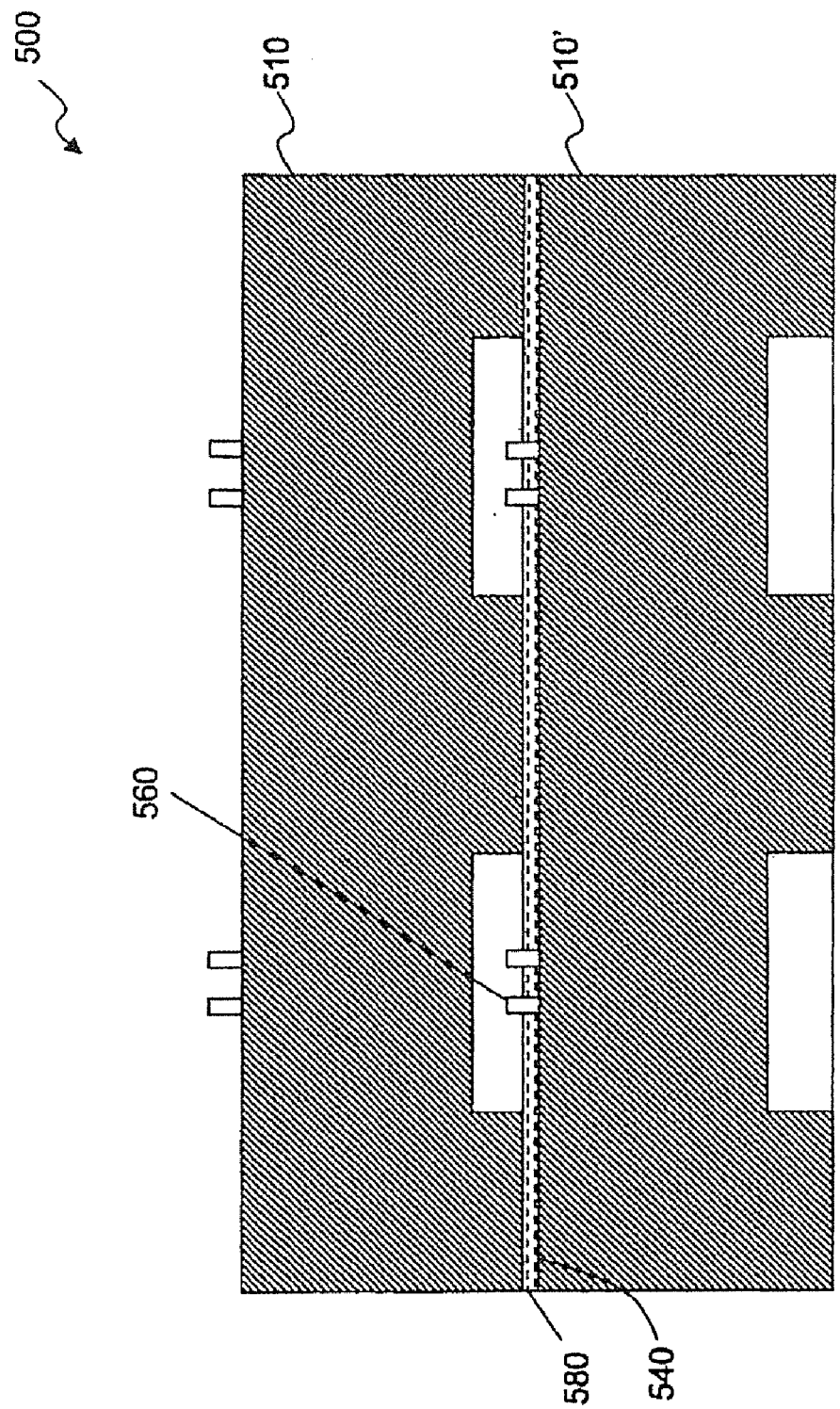
FIG. 5 shows a diagram of a cross-sectional view of a multi-layer IC structure formed through thermocompression bonding in accordance with an embodiment of the present invention.

FIGS. 4 and 5 show diagrams of cross-sectional views of embodiments of multi-layer IC structures 400 and 500, formed through direct bonding and thermocompression, respectively.

Referring to FIG. 4, wafers 410 and 410' are bonded together via direct bonding according to the process described with reference to the step of 120 of FIG. 1a. Bonding material 420 and 420' are applied to surfaces 430 and 440 of the wafers 410 and 410', respectively, and the surfaces 430 and 440 are brought into contact with one another.

The bonding material 420 and 420' should have a sufficiently high thermal conductivity that allows a substantial amount of heat to travel between the wafers 410 and 410' through the bonding material 420 and 420'. In one embodiment, the bonding material 420 and 420' are thin oxide each applied to a thickness of approximately 50 Å. The thickness to which the bonding material 420 and 420' are applied is only a few atomic layers thick, and therefore the bonding material 420 and 420' do not create a sizeable thermal resistance. In other embodiments, the bonding material 420 and 420' can be any other thin adhesive material with a thermal conductivity comparable to the thermal conductivity of thin oxide.

The oxide-oxide bond formed by the bonding material 420 and 420' is sufficiently strong to withstand growth substrate removal by mechanical lapping and device processing. In one embodiment, the wafers 410 and 410' are aligned in a bond fixture using an EV Group Wafer Alignment System (EVG601) and bonded in an EV Group (EVG520) Wafer Bonding System at a temperature less than 150° C. In various embodiments, typical surface energy for the bonded pair is approximately 500 mJ/m$^2$ after bonding.

In the embodiment shown in FIG. 4, the bonding material 420 and 420' are shown as coating substantially the entire surface of the regions at which the cavities and devices of 410 and 410', respectively, are not located. In other embodiments, the bonding material 420 and 420' may cover fewer areas.

Referring to FIG. 5, wafers 510 and 510' are bonded together via thermocompression bonding. Thermocompression is performed by compressing two or more wafers at a suitable pressure and temperature. In one embodiment, the wafers 510 and 510' are compressed at a temperature of 250° C. or more using gold (Au) as the bonding material. The pressure required to perform successful thermocompression of gold at 250° C. is approximately 6-10 MPa. In some embodiments, the temperature used is between 250-300° C.

Because devices 560 fabricated on the wafer 510' are part of an integrated circuit, pre-existing transmission lines 580 on a surface 540 of the wafer 510' may connect the devices 560. In one embodiment, the transmission lines 580 connecting the devices 560 are Au lines. The wafers 510 and 510' are compressed at 250° C., and a thermocompression bond is created between the two wafers 510 and 510' using the Au line as the bonding material. Accordingly, the transmission lines 580 serve a dual purpose of providing connectivity between devices and simultaneously serving as a bonding material to create a multi-layer IC structure 500 shown in FIG. 5.

In another embodiment (not shown), 1 µm of Au is applied intermittently along the surfaces of the wafers that contact upon compression of the wafers. The Au is applied along each surface at locations at which neither the cavities nor devices are located. Accordingly, after bonding, the bonded structure includes alternating layers of high thermal conductivity substrate and Au layer. Air pockets may exist between neighboring Au locations.

Figure 6:
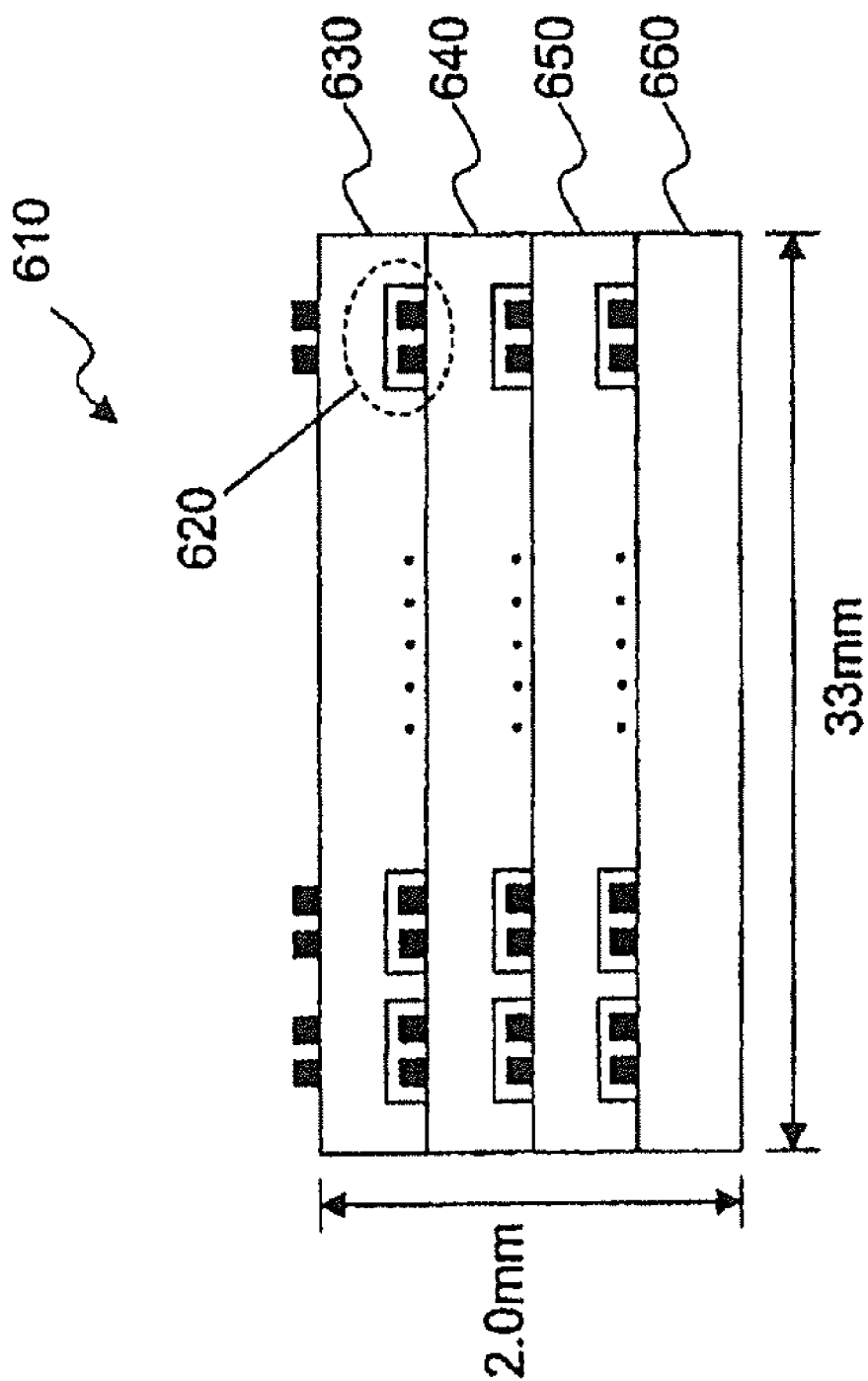
FIG. 6 shows a diagram of a cross-sectional view of a multi-layer high-power grid amplifier array according to an embodiment of the present invention.

FIG. 6 shows diagram of cross-sectional view of an embodiment of a multi-layer high-power grid amplifier array 610 and an amplifier pair 620 of the amplifier array 610, respectively. The grid amplifier array 610 includes four structured wafers 630, 640, 650, 660 each of which contains an array of amplifiers fabricated thereon. The structured wafers are bonded together using either the direct bonding or one of the embodiments of the thermocompression method taught with reference to FIGS. 4 and 5.

In one embodiment, each structured wafer 630, 640, 650 and 660 is 33 mm wide, and the total multi-layer high-power grid amplifier array 610 has a thickness of approximately 2 mm.

In the embodiment shown in FIG. 6, each cavity receives an amplifier pair 620 that is spaced approximately 50 µm from a neighboring amplifier pair 620. The amplifier pairs 620 are impedance matched to create an optimum coupling between the amplifier pairs 620, thereby enabling the amplifier pairs 620 to amplify power as a single device.

By way of example, a source (e.g., an active gain medium) that can provide 1 kW of continuous power at 95 GHz in less than 5 cm³ can be constructed in accordance with the embodiment shown in FIG. 6. The source consists of four-stacked grid amplifier array layers, and each array is approximately 4 cm², separated by 0.5 mm. Each of the grid amplifier array layers contains approximately 70,000 amplifier cells spaced 0.15 mm apart on a square lattice. Each of the amplifier cells contains two devices forming a differential pair, with 5 μm² emitter area for each device. The amplifier pairs radiate approximately 10 mW of CW RF power with a combined output power of 500 W/layer (this assumes approximately 1.5 dB total combining loss). The four active grid amplifier array layers of the source couple to produce a total of 1 kW of CW power at 95 GHz. The heat dissipation of the source is about 9 kW (this assumes 15% amplifier efficiency and 1.5 dB combining loss), which is distributed over the four layers of the stack, producing an average DC power density of approximately 150 W/cm² for each layer. In order to ensure the normal operation of the active devices, which are the sources of thermal energy, the active devices are mounted on substrates with high thermal conductivity according to the methods shown in FIGS. 1a and 1c.

In another embodiment, multiple transistors (or devices generally) are interconnected with multiple layers of interconnects that are all within the cavity.

Figure 8:
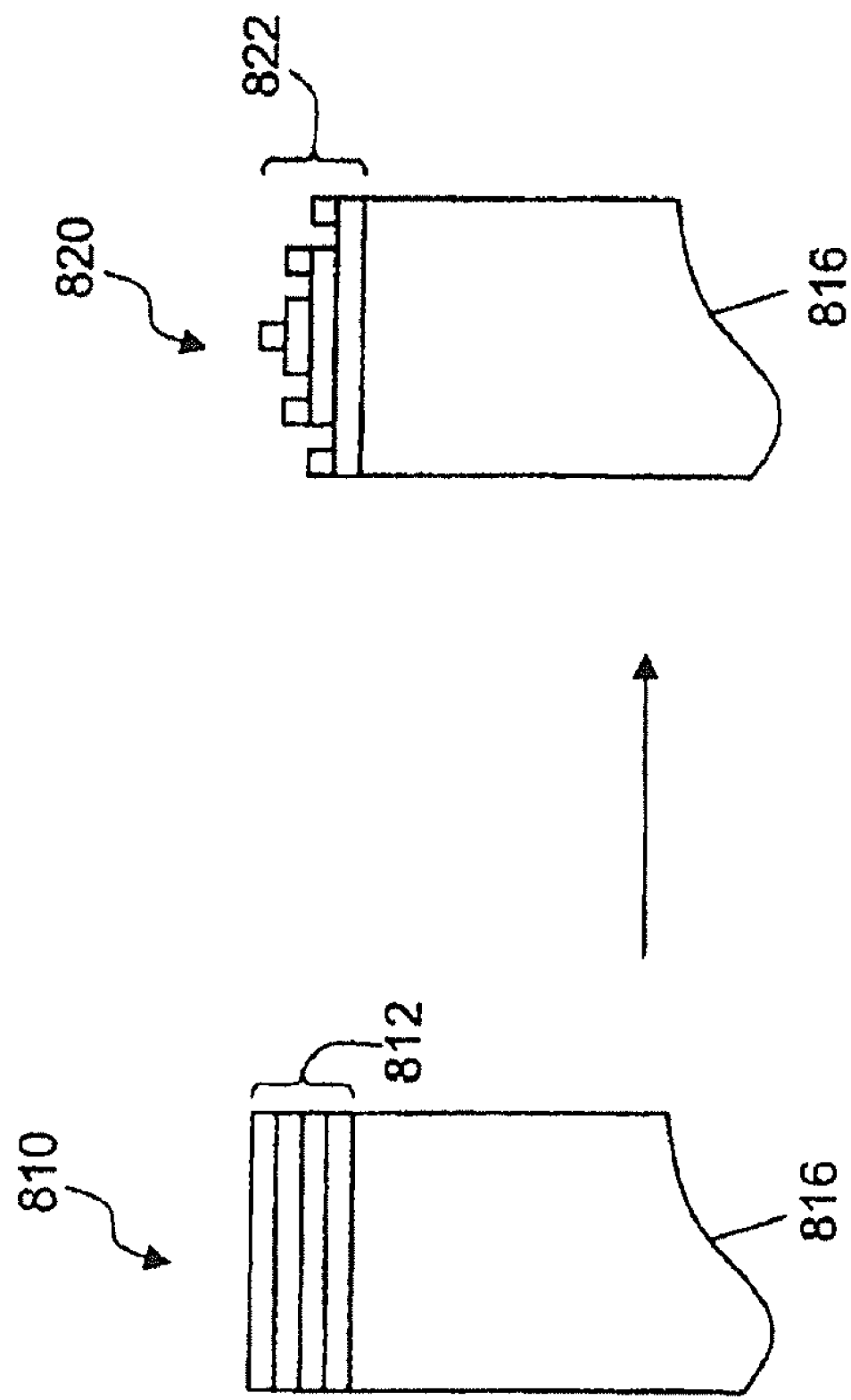
FIG. 8 shows a schematic diagram of a method of fabricating a layer of the multi-layer IC structure of FIG. 7a according to an embodiment of the present invention.

FIGS. 7a, 7b and 7c show diagrams of simulated temperature distributions in multi-layer IC structures according to the described embodiments of the present invention. FIG. 8 shows a schematic diagram of an embodiment of a method of fabricating a layer of the multi-layer IC structure of FIG. 7a. In step 810 of FIG. 8, one or more device layers 812 are epitaxially grown on a growth substrate 816. In one embodiment, each device layer 812 is a thin layer grown to a thickness of approximately 1 μm.

The growth substrate 816 is composed of a material that may cause a small number of defects on the surface of an external device layer. In various embodiments, the growth substrate 816 is composed of, for example, indium phosphide (InP), which has a thermal conductivity of approximately 78 W/(m·K); gallium arsenide, which has a thermal conductivity of approximately 65 W/(m·K), or the like. However, the invention is not limited to these exemplary materials.

In step 820, the device (and circuit) layers 812 are processed into devices 822 and circuits (not shown) using standard fabrication techniques well-known to those of ordinary skill in the art.

In FIG. 8, a 3-layer device 822 is fabricated on the growth substrate 816. The 3-layer device 822 may be a transistor. For example, the bottom layer may be fabricated into the collector, the middle layer may be fabricated into the base and the top layer may be fabricated into the emitter. The 3-layer device 822 may also include a group of ICs or arrays of other devices. While in FIG. 1a, there is an epitaxial layer transfer process transferring the device layers from a growth substrate to an alternative substrate with higher thermal conductivity, in the method shown in FIG. 8, there is no epitaxial layer transfer process. Rather, the devices are formed of the device layers 812 that are maintained on the growth substrate 816.

Figure 9:
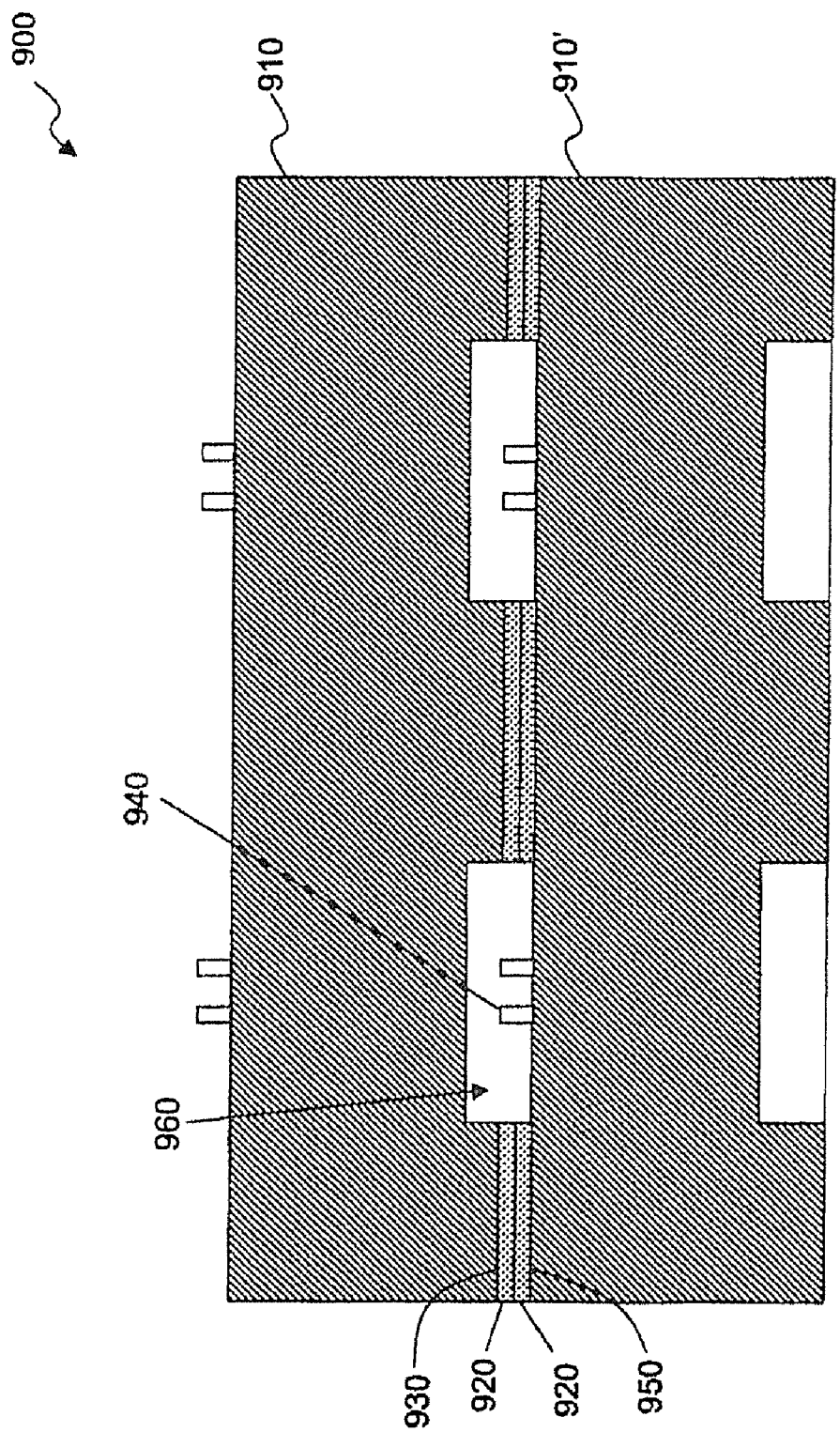
FIG. 9 shows a diagram of a cross-sectional view of a multi-layer IC structure such as that shown in FIG. 7a according to an embodiment of the present invention.

FIG. 9 shows a diagram of a cross-sectional view of an embodiment of a multi-layer IC structure 900 having layers formed through the method of FIG. 8. The structure includes two structured wafers 910, 910' each having cavities and devices, and in a stacked configuration creating the multi-layer IC structure 900.

The cavities 960 of structured wafer 910 are dimensioned to receive one or more devices 940 fabricated on structured wafer 910'. The cavities 960 are spaced at suitable spacing such that the heat dissipation of the devices 940 does not overheat neighboring devices. Accordingly, the spacing is dictated by the number of devices 940 on the wafer 910'.

In one embodiment, the cavities 960 are spaced at a distance to receive pairs of devices that must be spaced far enough apart to satisfactorily reduce the effects of mutual heating between the pairs of devices. Additionally, the cavities 960 are designed to be of height large enough to serve as a recess for the devices 940 fabricated on the second structured wafer 910' with the goal of maximizing the heat transfer between the various layers of the multi-layer IC structure 900. In alternate embodiments, the locations at which the cavities 960 are formed and the cavity dimensions may have different values. In one embodiment, the cavities 960 are formed by the front-to-backside lithography process described with reference to FIG. 2.

In the embodiment of FIG. 9, wafer 910' is shown as a structured wafer having cavities along its second surface. In alternate embodiments, however, the bottommost wafer (e.g., the second structured wafer 910') in the multi-layer IC structure 900 needs not include cavities. The wafers 910 and 910' may be bonded together via direct bonding or thermocompression.

In FIG. 9, the wafers 910 and 910' are shown as bonded via direct bonding. Bonding material 920 is applied to surfaces 930 and 950 of the wafers 910 and 910', respectively, and the surfaces 930 and 950 are brought into contact with one another. The bonding material 920 should have a suitably high thermal conductivity. Accordingly, the bonding material 920 allows a substantial amount of heat expended from one or more of the devices 940 to travel through the bonding material 920 and out of the structure through the wafers 910 and 910'. In one embodiment, the bonding material 920 is a thin oxide applied at a thickness of approximately 50 Å. The thickness at which the bonding material 920 is applied is only a few atomic layers thick, and therefore the bonding material 920 does not create a sizeable thermal resistance. In other embodiments, the bonding material 920 may be any other suitable material with a comparable thermal conductivity as the thin oxide.

The oxide-oxide bond is sufficiently strong to withstand growth substrate removal by mechanical lapping and device processing. In one embodiment, the wafers are aligned in a bond fixture using an EV Group Wafer Alignment System (EVG601) and bonded in an EV Group Wafer Bonding System (EVG520) at a temperature less than 150° C. In various embodiments, typical surface energy for the bonded pair is approximately 500 mJ/m² after bonding.

In the embodiment shown in FIG. 9, the bonding material 920 is shown coating substantially the entire surface of the regions at which the cavities and devices of wafers 910 and 910', respectively, are not located. In other embodiments, the bonding material 920 may cover much less than such areas. In other embodiments, the wafers 910 and 910' may be bonded together using thermocompression as described with reference to FIG. 5.

Referring back to FIG. 7a, wafers 710, 712, 714 and 716 are formed through the process described with reference to FIG. 8 and bonded to create the multi-layer structure of FIG. 7a. In one embodiment, the wafers 710, 712, 714 and 716 are bonded together in the manner described with reference to FIG. 9.

The structures of FIGS. 7a, 7b and 7c are of InP devices on InP, Si and SiC structured wafers, respectively. In FIG. 7a, the InP devices are grown on an InP substrate and are not transferred via the epitaxial layer transfer process described with reference to FIG. 1a. In FIGS. 7b and 7c, however, the InP devices have been transferred via the epitaxial layer transfer process to Si and SiC substrates, respectively. Both Si and SiC substrates have higher thermal conductivity than the InP substrate.

The simulations results shown in FIGS. 7a, 7b and 7c were performed using finite element analysis with the following parameters. Each of the four grid amplifier layers (i.e., 710, 712, 714 and 716) was assumed to have an area of approximately 4 cm$^2$ and a thickness of approximately 0.5 mm. The total thickness of all four layers was approximately 0.2 cm. Each grid amplifier layer contains approximately 70,000 amplifier devices spaced 0.15 mm apart on a square lattice. Each cavity contains two amplifier devices forming a differential pair, with emitter area of approximately 5 µm$^2$ for each device. Each pair of amplifier devices radiates approximately 10 mW of power with a combined output power of 500 W per layer (assuming approximately 1.5 dB total combined loss). The four layers coupled together produce a total of 1 kW of power at 95 GHz. The heat dissipation was assumed to be approximately 9 kW (this assumes 15% amplifier device efficiency and 1.5 dB combined loss), which was distributed over the four layers, producing an average DC power density of approximately 150 W/cm$^2$ for each layer.

The bottommost layer of each device was in intimate contact with a heat sink that was at 0° C. (not shown). The thin device layers of approximately 2 µm were assumed to readily transfer heat generated within the layer to the layer beneath it.

As shown in FIG. 7a, the InP devices on the four layers have temperatures of 74-170° C. InP devices can operate at a temperature at 125° C. or less and fail at higher temperatures. Accordingly, only the two lowest wafers 714 and 716 are able to maintain the temperatures at which the InP devices could operate, i.e., 107° C. and 74° C. However, the temperature distribution of the multi-layer apparatus shown in FIG. 7a provides an improved temperature distribution as compared to conventional multi-layer apparatus composed of InP devices on InP growth substrates, which do not contain cavities formed therein and are not bonded with bonding material with a suitable thermal conductivity. One such conventional structure includes wafers that are bonded together using a continuous layer of SiO2 applied at a thickness of approximately 10 µm between each two wafers.

As shown in FIGS. 7b and 7c, by contrast to the layers of FIG. 7a, the InP devices on the layers of the structures of FIGS. 7b and 7c are between 33-77° C. and 16-33° C., respectively. Accordingly, Si and SiC wafers allow the InP devices to operate within safe operating ranges, thereby leading to longer lifetimes of the InP devices, especially for high-power applications.

Although the present invention has been described with reference to certain exemplary embodiments, as is known to those of ordinary skill in the art, the present invention is not limited to the disclosed embodiments, but, on the contrary, is intended to cover various modifications and equivalents arrangements within the scope and spirit of the appended claims, and their equivalents.

What is claimed is:

1. A method of fabricating a multi-layered amplifier apparatus capable of producing at least 1 kW of continuous power, the method comprising:

forming a plurality of amplifier devices on first sides of a plurality of semiconductor substrates arranged in a stack, each of the plurality of semiconductor substrates configured to produce an average power density higher than 100 W/cm$^2$;

forming a plurality of cavities on a second side of at least one of the plurality of semiconductor substrates, wherein the plurality of cavities are structured to receive the corresponding ones of the plurality of amplifier devices on an adjacent one of the plurality of semiconductor substrates; and bonding the plurality of semiconductor substrates together, wherein the plurality of semiconductor substrates each have thermal conductivities higher than 150 W/(m·K).

2. The method of claim 1, wherein said forming the plurality of amplifier devices on the first sides of the plurality of semiconductor substrates comprises:

providing an epitaxial layer on a growth substrate, the epitaxial layer having one or more device layers, one of the one or more device layers being an external device layer distal from the growth substrate;

bonding the external device layer to one of the plurality of semiconductor substrates having a thermal conductivity higher than that of the growth substrate;

removing the growth substrate; and fabricating one or more amplifier devices from the one or more device layers of the epitaxial layer.

3. The method of claim 2, wherein said one of the plurality of semiconductor substrates comprises one of silicon, silicon carbide, aluminum nitride, or diamond.

4. The method of claim 1, wherein the plurality of semiconductor substrates are bonded together by direct bonding.

5. The method of claim 1, wherein the plurality of semiconductor substrates are bonded together by thermocompression.

* * * * *